(12) United States Patent
Taylor et al.

(10) Patent No.: US 6,567,046 B2
(45) Date of Patent: May 20, 2003

(54) RECONFIGURABLE ANTENNA

(75) Inventors: Gordon C. Taylor, Princeton, NJ (US); Stewart M. Perlow, Marlboro, NJ (US); Arye Rosen, Cherry Hill, NJ (US); Aly E. Fathy, Langhorne, PA (US); Sridhar Kanamaluru, W. Windsor, NJ (US); Moniem Esherbiny, Laguna Niguel, CA (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/812,701

(22) Filed: Mar. 20, 2001

(65) Prior Publication Data

US 2002/0039083 A1 Apr. 4, 2002

Related U.S. Application Data

(60) Provisional application No. 60/190,686, filed on Mar. 20, 2000, and provisional application No. 60/245,838, filed on Nov. 3, 2000.

(51) Int. Cl.[7] .................................................. H01Q 1/38
(52) U.S. Cl. ............................... 343/700 MS; 343/793; 343/876; 343/915
(58) Field of Search .......................... 343/915, 700 MS, 343/703, 705, 753, 754, 755, 756, 793, 876

(56) References Cited

U.S. PATENT DOCUMENTS 4,521,781 A   6/1985  Campi et al. ........  343/700 MS (List continued on next page.)

FOREIGN PATENT DOCUMENTS

| WO | WO 01/71819 A2 | 3/2001 | ......... H01L/29/868 |
|---|---|---|---|
| WO | WO 01/80258 A2 | 4/2001 | ............ H01H/1/00 |

OTHER PUBLICATIONS

Targonski and Pozar, "Analysis and Design of a Microstrip Reflectarray Using Patches of Variable Size", *IEEE Symposium on Antennas and Propagation Digest*, vol. 3, pp. 1820–1823, Jun. 1994.

(List continued on next page.)

*Primary Examiner*—Don Wong
*Assistant Examiner*—Shih-Chao Chen
(74) *Attorney, Agent, or Firm*—William J. Burke

(57) ABSTRACT

A reconfigurable antenna capable of dynamic reconfigurability of several antenna parameters. Specifically, the present invention is an antenna comprising a plurality of surface PIN devices arranged in a gridlike array. Each of the SPIN devices can be individually activated or deactivated. When a SPIN device is activated, the surface of the device is injected with carriers such that a plasma is produced within the intrinsic region of the device. The plasma can be sufficiently conductive to produce conductor or metal like characteristics at the surface of the device. Various ones of the SPIN devices can be activated to electronically paint a conductive pattern upon the substrate supporting the PIN devices. Through selective activation of the SPIN devices various surface antenna patterns can be produced upon the substrate including dipoles, cross dipoles, loop antennas, Yagi-Uda type antennas, log periodic antennas, and the like. Additionally, the SPIN device grid may be selectively activated to produce holographic antennas. In a holographic antenna the SPIN devices are activated to produce a simulated metallization pattern that is excited by a surface RF wave transmitted onto the substrate from a surface mounted dipole antenna. The surface wave excites a particular antenna pattern depending upon the shape of the activated SPIN devices. Changing the pattern of the holographic antenna elements causes a beam steering and/or frequency adjustments of the antenna.

9 Claims, 6 Drawing Sheets

U.S. PATENT DOCUMENTS

| | | | | |
|---|---|---|---|---|
| 4,716,417 A | * | 12/1987 | Grumet | 343/708 |
| 4,843,358 A | * | 6/1989 | Meise et al. | 333/263 |
| 5,444,454 A | | 8/1995 | White | 343/754 |
| 5,745,082 A | | 4/1998 | Alder | 343/753 |
| 5,828,344 A | * | 10/1998 | Alder et al. | 343/755 |
| 5,864,322 A | * | 1/1999 | Pollon et al. | 343/754 |
| 5,930,031 A | * | 7/1999 | Zhou et al. | 359/344 |
| 6,020,853 A | * | 2/2000 | Richards et al. | 343/700 MS |
| 6,175,332 B1 | * | 1/2001 | Fedors | 343/700 MS |
| 6,177,909 B1 | * | 1/2001 | Reid et al. | 343/700 MS |

OTHER PUBLICATIONS

Targonski et al., "Design of Millimeter Wave Microstrip Reflectarrays", *IEEE Trans. on Antennas and Propagation*, vol. 45, No. 2, pp. 287–296, Feb. 1997.

Huang and Pogorzelski, "A Ka–Band Microstrip Reflectarray with Elements Having Variable Rotation Angles", *IEEE Trans. on Antennas and Propagation*, vol. 46, No. 5, pp. 650–656, May 1998.

Pozar et al., "A Shaped–Beam Microstrip Patch Reflectarray", *IEEE Trans. on Antennas and Propagation*, vol. 47, No. 7, pp. 1167–1173, Jul. 1999.

Iizuka et al. "Volume–Type Holographic Antenna", *IEEE Transactions on Antennas and Propagation*, Succinct Papers, pp. 807–810, Nov. 1975.

* cited by examiner ated or deactivated. When a SPIN device is activated, the surface of the device is injected with carriers such that a plasma is produced within an intrinsic region of the SPIN device. The plasma is sufficiently conductive to produce conductor or metal-like characteristic at the surface of the device. Various ones of the SPIN devices in a SPIN device array can be activated to electronically "paint" a conductive pattern upon the substrate supporting the SPIN devices. Through selective activation of the SPIN devices, various surface antenna patterns can be produced upon the substrate including dipoles, cross dipoles, loop antennas, Yagi-Uda type antennas, log periodic antennas, and the like.

RECONFIGURABLE ANTENNA

CROSS-REFERENCE TO RELATED APPLICATIONS

This application claims benefit of U.S. provisional patent application serial No. 60/190,686, filed Mar. 20, 2000, and serial No. 60/245,838, filed Nov. 3, 2000, both of which are herein incorporated by reference.

This application contains subject matter related to U.S. patent application Ser. No. 09/812,702, filed simultaneously herewith, which is herein incorporated by reference.

BACKGROUND OF THE INVENTION

1. Field of the Invention

The invention generally relates to antenna systems and, more particularly, the invention relates to a reconfigurable antenna.

2. Description of the Related Art

The detection, location, identification, and characterization of electromagnetic (EM) signals of types that have a low probability of intercept is an increasingly challenging problem. In general, EM signals with a low probability of intercept are transmitted by adversarial sources and thus employ various methods to reduce their signature. Such methods include frequency hopping, multiple signal polarizations, and spread spectrum encoding techniques. In addition, the locations of the sources of such signals are not fixed and may change quite rapidly. The number of sources or EM signals that need to be located and tracked may also change depending on the particular circumstances.

A broadband antenna is generally required in order to track such EM signals. Frequency independent antennas such as spirals and quasi frequency independent antennas such as log periodic antennas are quite large and their use in antenna array is quite limited. Also, an adaptive array using such broadband elements would require a feed structure integrated to a true time delay network in order to achieve multiple beams and beam scanning. Such feed networks are difficult to design and are expensive to implement.

Therefore, there exists a need in the art for a reconfigurable antenna capable of dynamic reconfiguration of operating frequency, polarization, bandwidth, number of beams and their spatial directions, and radiation pattern shape without the need for a complex feed network.

SUMMARY OF THE INVENTION

The disadvantages associated with the prior art are overcome by a reconfigurable antenna capable of dynamic reconfigurability of several antenna parameters. Specifically, the present invention is an antenna comprising a plurality of surface PIN (SPIN) devices arranged in a gridlike array. Each of the SPIN devices in the array can be individually activated or deactivated. When a SPIN device is activated, the surface of the device is injected with carriers such that a plasma is produced within an intrinsic region of the SPIN device. The plasma is sufficiently conductive to produce conductor or metal-like characteristic at the surface of the device. Various ones of the SPIN devices in a SPIN device array can be activated to electronically "paint" a conductive pattern upon the substrate supporting the SPIN devices. Through selective activation of the SPIN devices, various surface antenna patterns can be produced upon the substrate including dipoles, cross dipoles, loop antennas, Yagi-Uda type antennas, log periodic antennas, and the like.

Additionally, the SPIN device array may be selectively activated to produce holographic antennas. In a holographic antenna, the SPIN devices are activated to produce a holographic metallization pattern. The pattern is excited by a surface RF wave transmitted onto the substrate from a surface mounted radiator such as a surface mounted dipole antenna. The surface wave excites a particular antenna pattern depending upon the shape of the pattern produced by the activated SPIN devices. Changing the pattern of the SPIN devices results in beam steering of the antenna radiation pattern.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
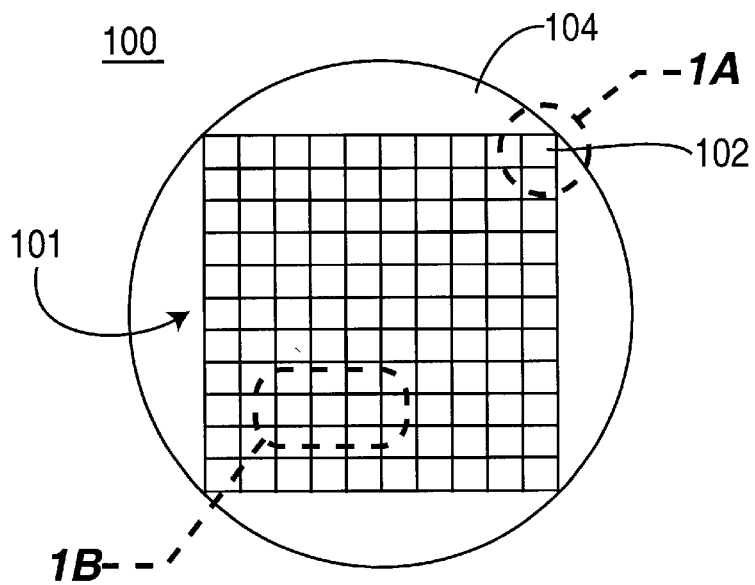
Figure 1A:
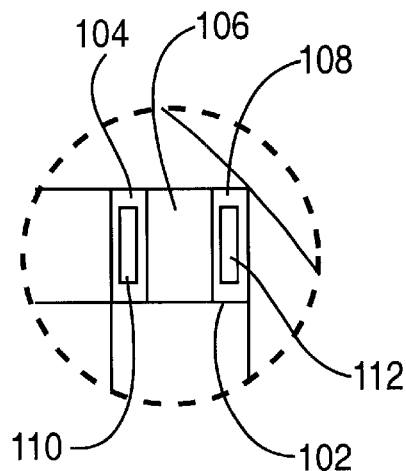
Figure 1B:
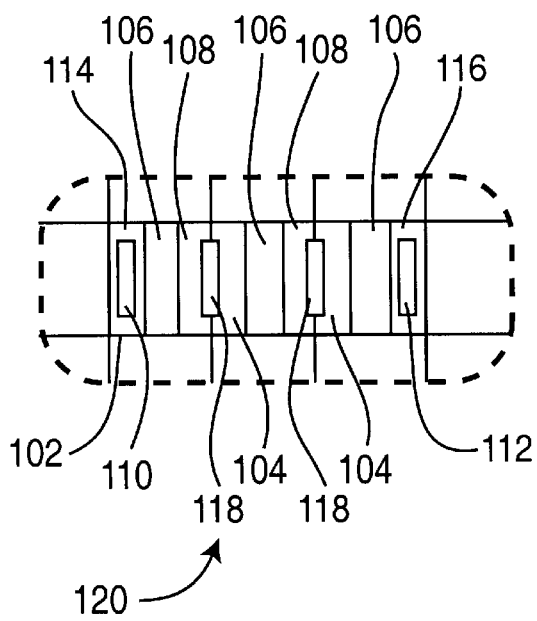
Figure 2:
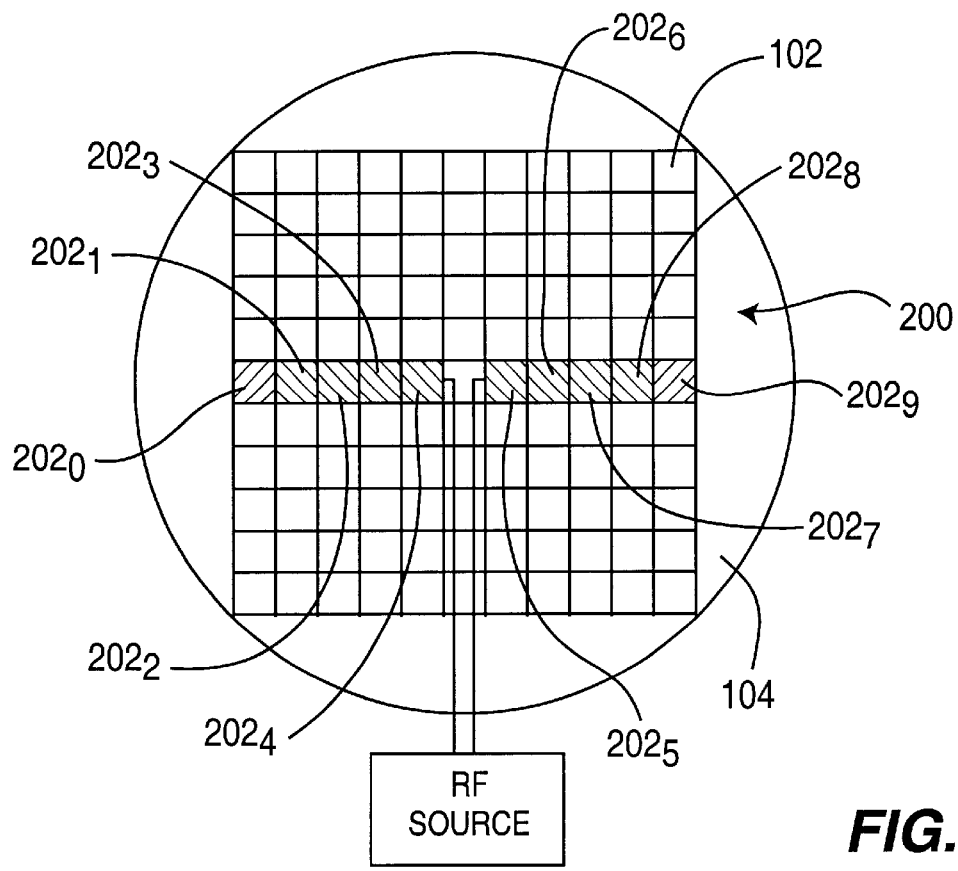
Figure 3:
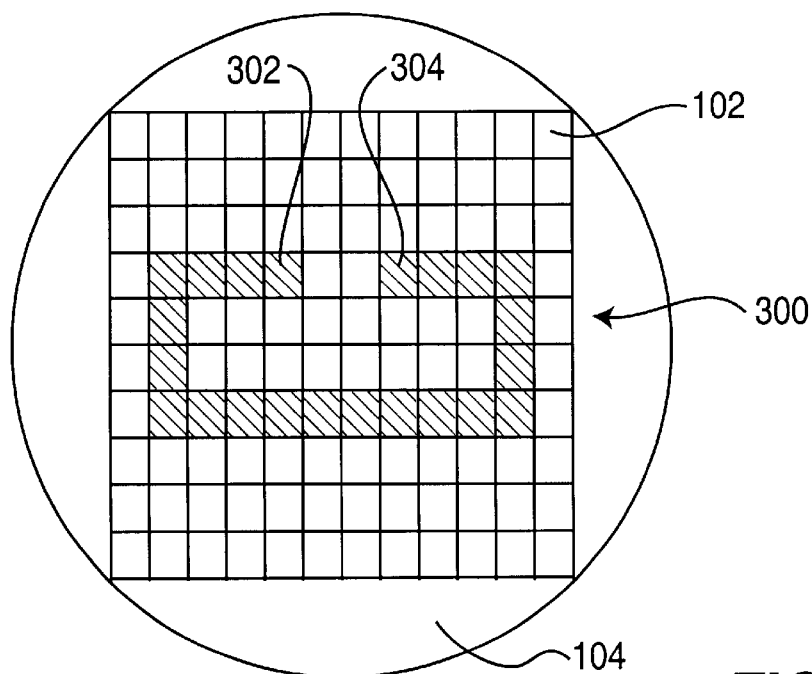
Figure 4:
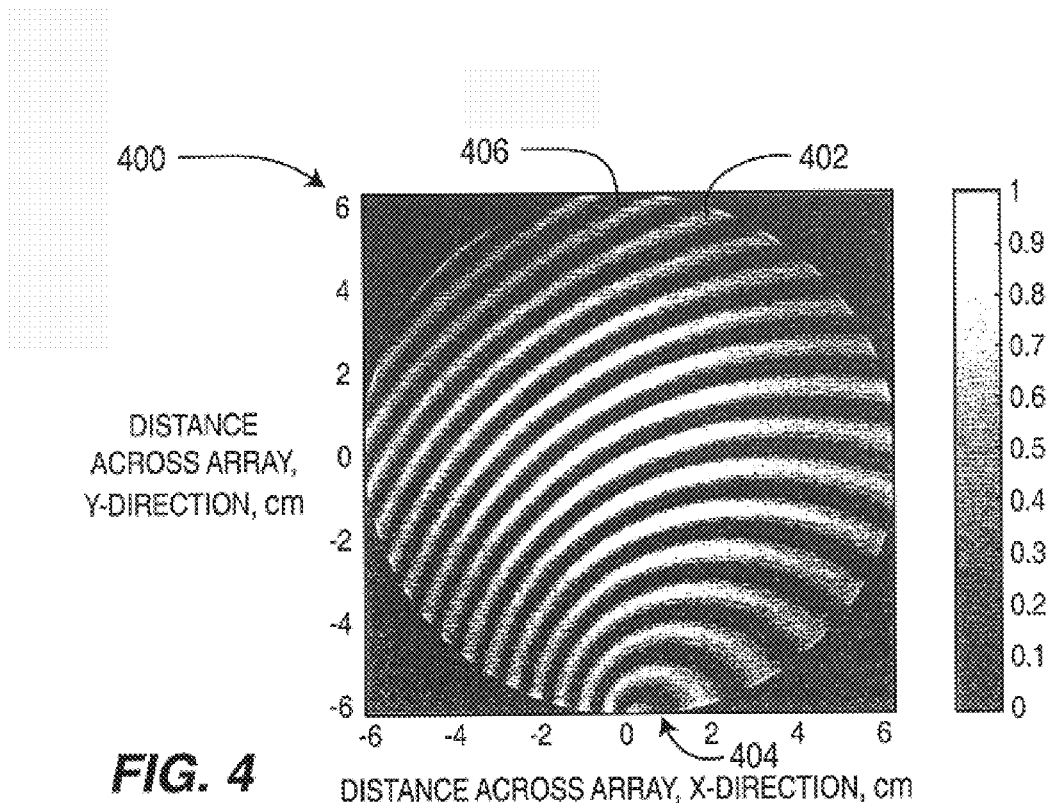
Figure 5:
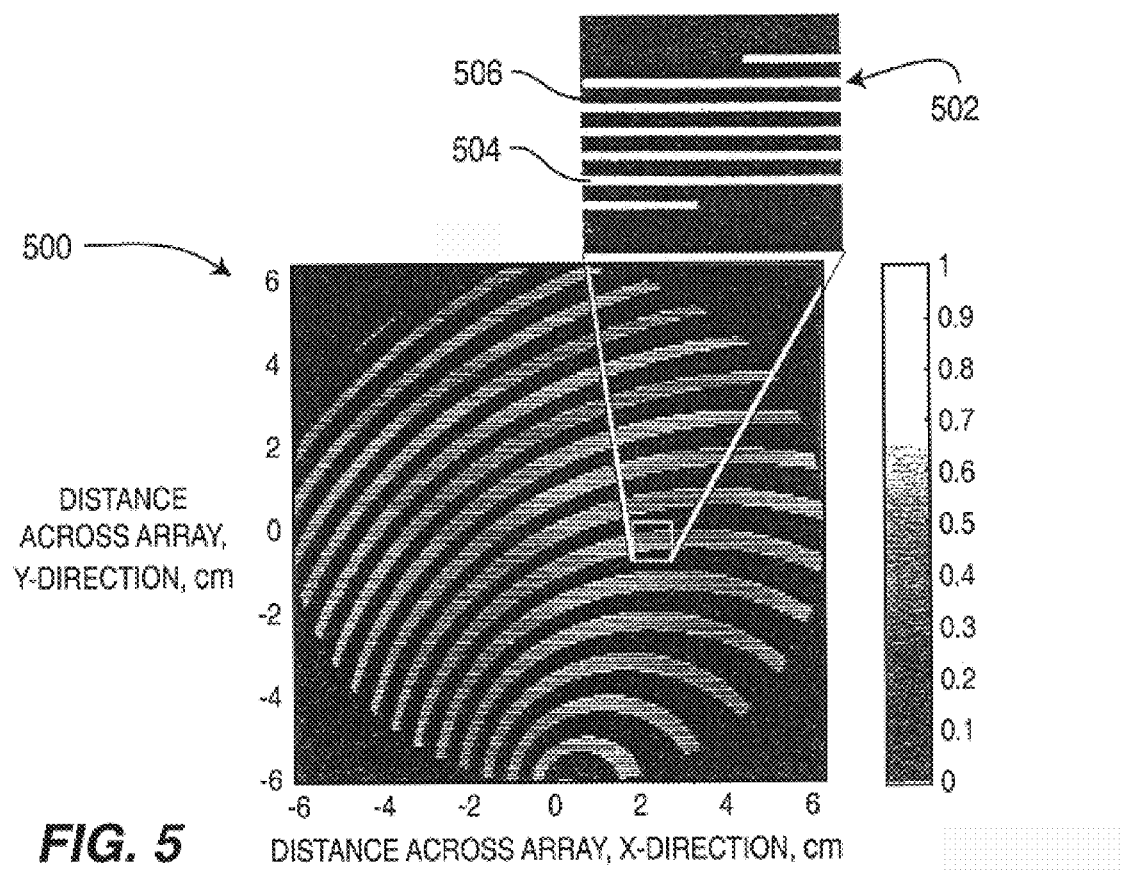
Figure 6:
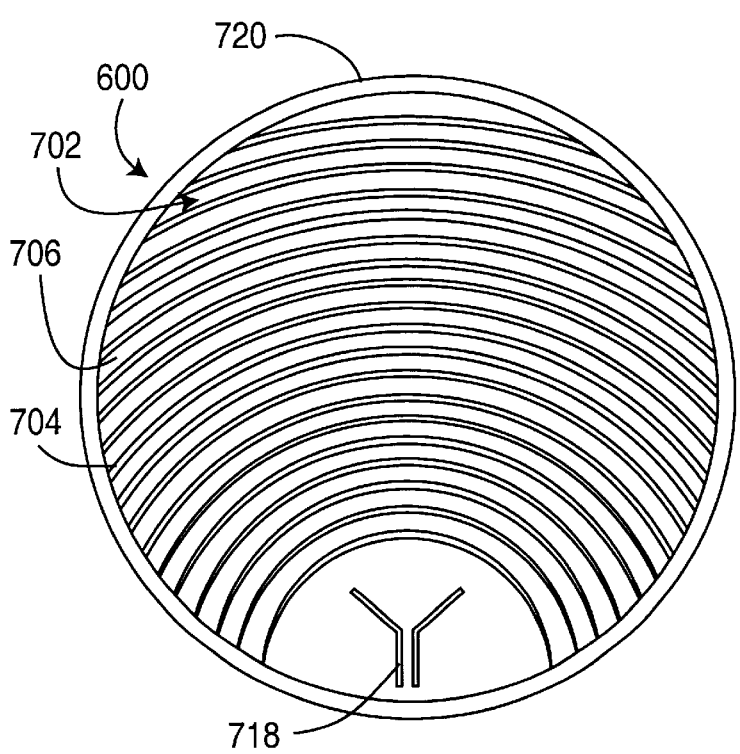
Figure 7:
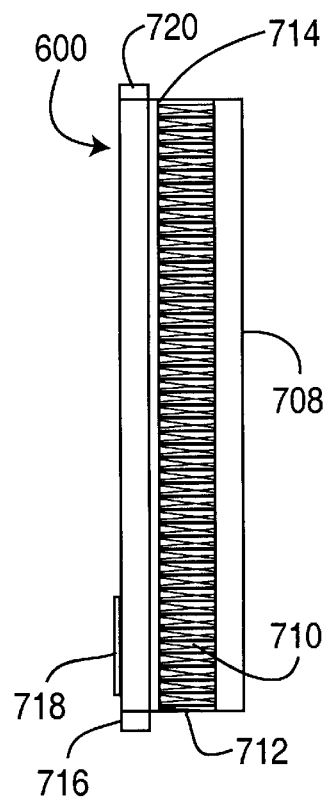
Figure 8:
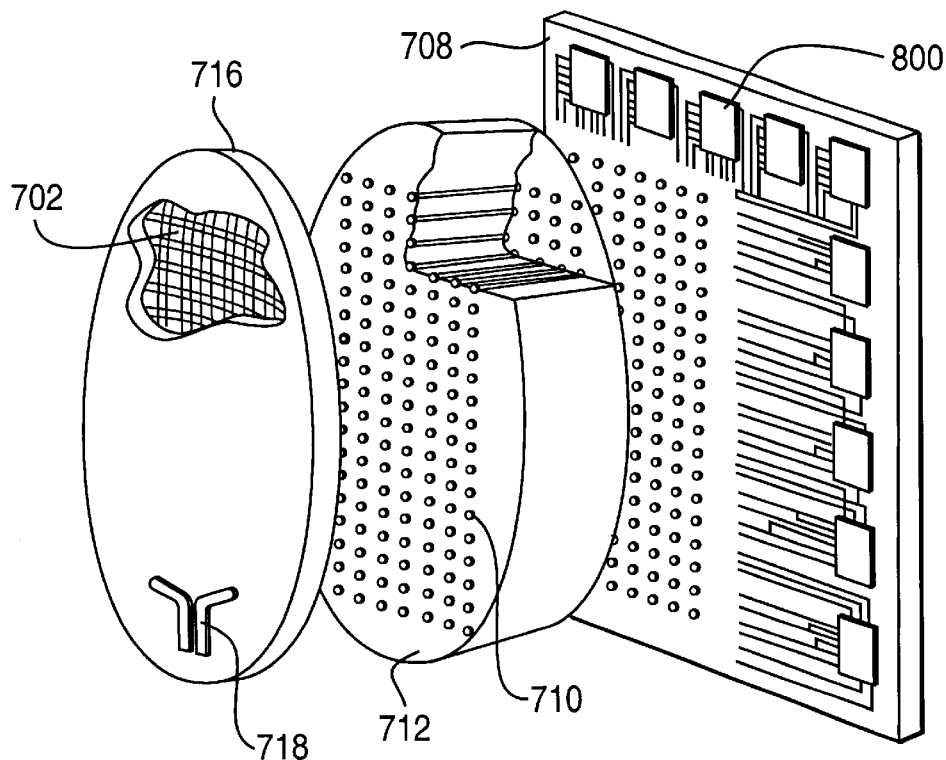
Figure 9:
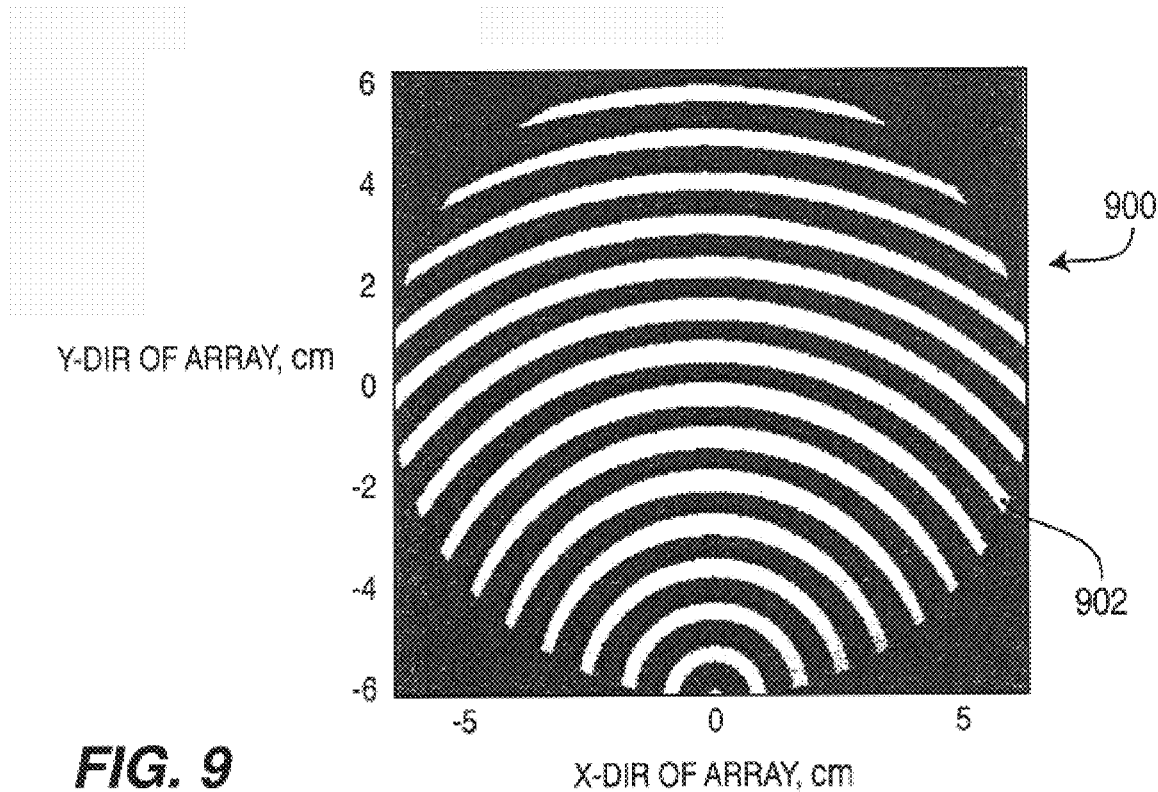
Figure 10:
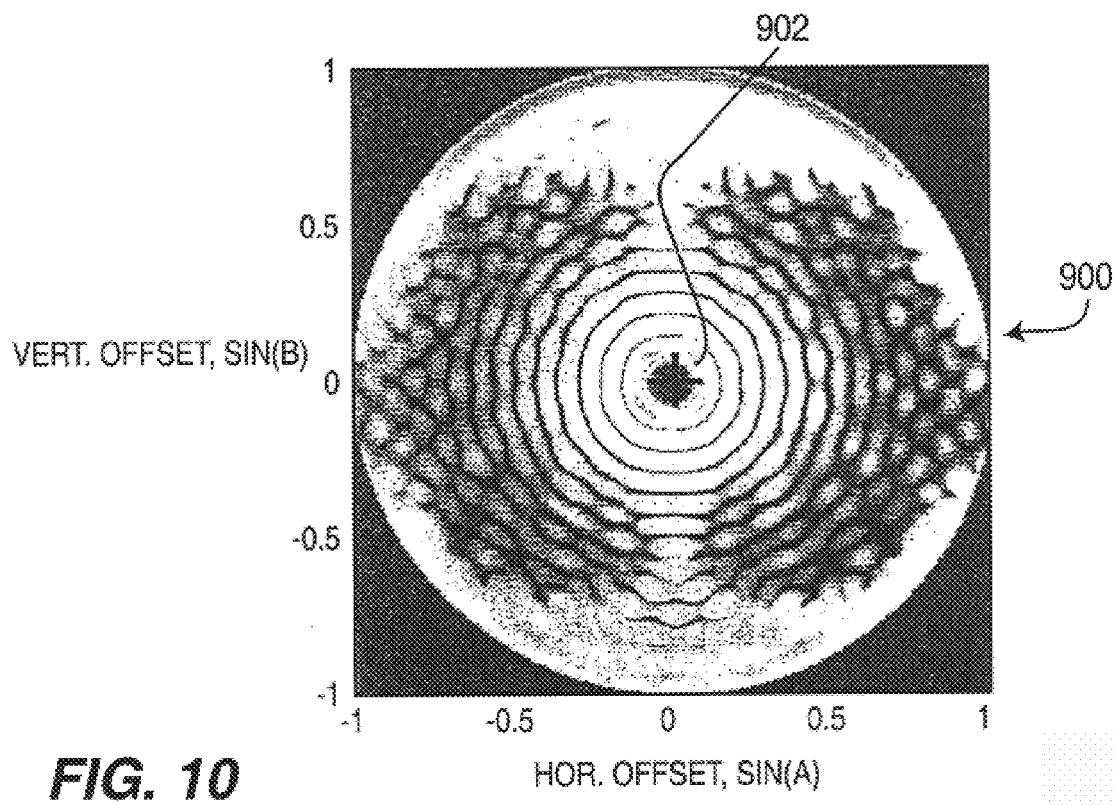
Figure 11:
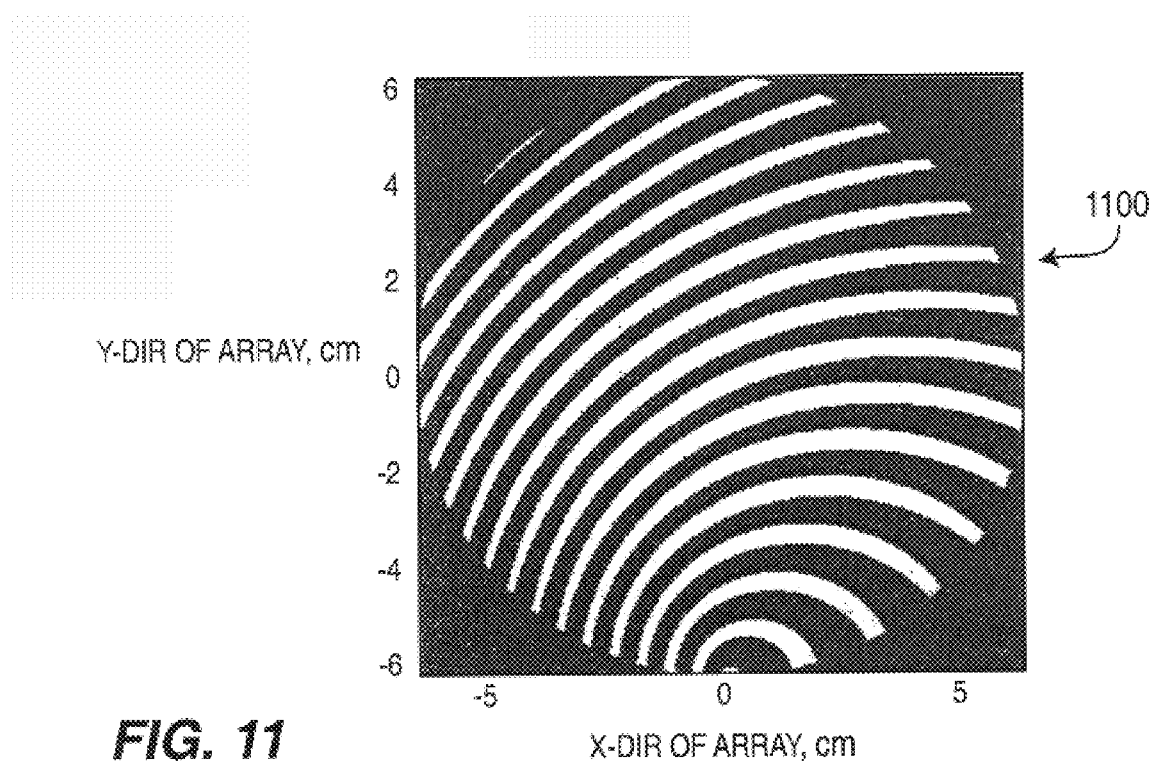

Teachings of the present invention can be readily understood by considering the following detailed description in conjunction with the accompanying drawings, in which:

FIG. 1 depicts a top plan view of a reconfigurable antenna in accordance with the present invention;

FIG. 2 depicts a top plan view of a dipole antenna that is generated by configuring the reconfigurable antenna of FIG. 1;

FIG. 3 depicts a top plan view of a loop antenna generated by configuring the reconfigurable antenna of FIG. 1;

FIG. 4 depicts an ideal holographic metallization pattern for a holographic antenna;

FIG. 5 depicts an array approximation for the holographic pattern of FIG. 4;

FIG. 6 depicts a top plan view of a holographic antenna;

FIG. 7 depicts a side view of the holographic antenna of FIG. 6;

FIG. 8 depicts an perspective, exploded view of a holographic antenna;

FIG. 9 depicts an array pattern for a particular holographic antenna;

FIG. 10 depicts the radiation pattern generated by the array pattern of FIG. 6;

FIG. 11 depicts an array pattern for a particular holographic antenna; and

Figure 12:
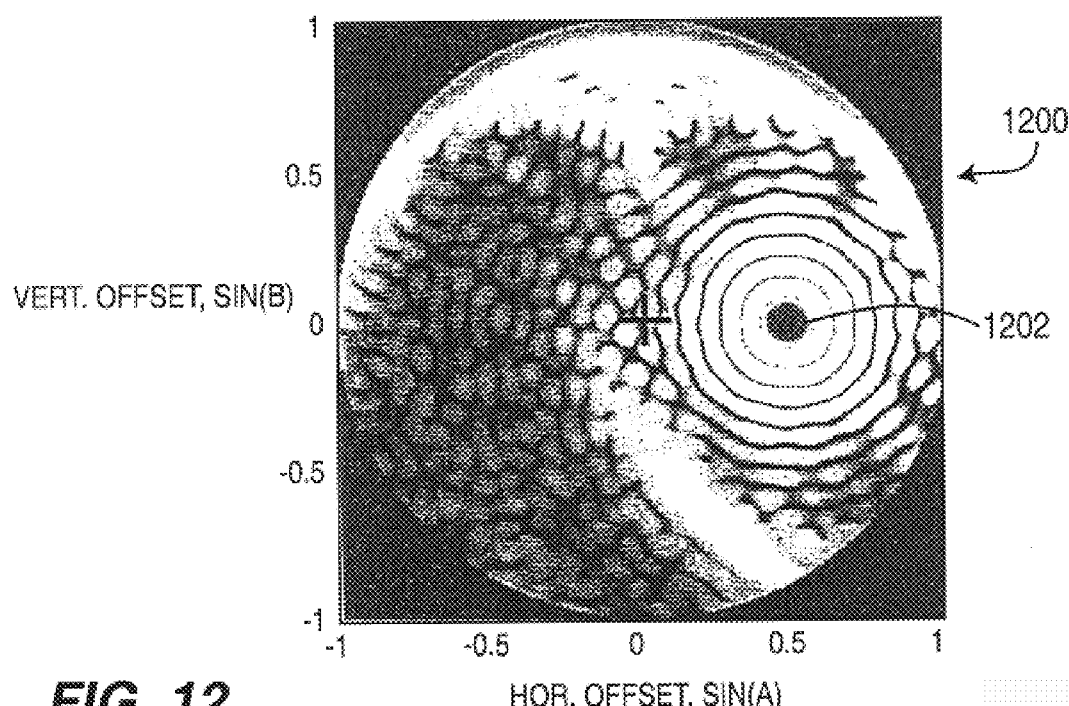

FIG. 12 depicts a radiation pattern for the array pattern of FIG. 8.

DETAILED DESCRIPTION OF THE PREFERRED EMBODIMENT

FIG. 1 depicts a top plan view of a reconfigurable antenna 100 comprising a plurality of surface PIN (SPIN) devices 102 fabricated as an array 101 upon a substrate 104. Each of the SPIN devices 102, as shown in detailed view 1B of FIG. 1, comprises a P+ region 104 and N+ region 108 separated by an intrinsic region 106. A conductive contact 110 is provided for the P+ region 104 and a conductive contact 112 is provided for the N+ region 108. These contacts 110 and 112 provide a contact point for a DC bias voltage that is used to activate and deactivate each of the SPIN devices. Each device in the array has such contacts such that each device can be activated and deactivated individually. One technique for fabricating a surface PIN device array is disclosed in detail in U.S. patent application Ser. No. 09/812,702, filed simultaneously herewith (Attorney Docket No. SAR 14191) and herein incorporated by reference.

In one embodiment of the invention, as depicted in detailed view 1B of FIG. 1, a plurality of SPIN devices 102 are arranged in series, where adjacent SPIN devices have their respective P+ and N+ regions 104 and 108 connected by a conductive island (metal bridge) 118. As such, the "end" P+ and N+ regions 114 and 116 have the contacts 110 and 112. The contacts 110 and 112 are respectively connected to positive and negative terminals of a DC power supply to activate all the series connected SPIN devices 102. The number of SPIN devices 102 connected in this manner defines a pixel 120 having a "pixel" resolution for an antenna that is produced by the activated SPIN devices 102. In other embodiments of the invention, other connective combinations of SPIN devices could be used to define the "pixels" including parallel and series/parallel combinations. Such arrangements reduce the number of connective leads or pins that need to be used to supply DC bias to the array 101.

FIG. 2 depicts a top plan view of the antenna 100 having been configured to produce a dipole antenna 200. The dipole antenna 200 is created by activating a plurality of SPIN devices $202_1$ through $202_8$ such that each half of the dipole antenna 200 has a length of one quarter wavelength. The RF source 208 is applied to the innermost SPIN devices $202_4$ and $202_5$. If the frequency of the RF source 208 were to change, the dipole 200 could be lengthened by activating additional SPIN devices such as $202_0$ and $202_9$, or shortened by deactivating the end SPIN devices $202_1$ and $202_8$. As such, the dipole 200 can be dynamically reconfigured to accommodate various frequency sources.

Similarly, FIG. 3 depicts a dipole loop antenna 300 configured by activating various SPIN devices to form a loop shaped structure on the surface of the substrate 104. The RF source is applied to the ends of the loop at SPIN devices 302 and 304.

In a similar manner, other antenna structures including antenna arrays such as Yagi-Uda antenna arrays and log periodic antenna arrays can be fabricated by activating and deactivating certain ones of the SPIN devices. The groupings of devices that are activated operate like a metallization pattern on the surface of the substrate such that some of the activate device areas can be driven with an RF voltage while others operate as reflector elements and director elements within the antenna structure. In this manner, any surface-mount antenna structure can be created on the substrate 104 by activating and deactivating various ones, or combinations thereof of the SPIN devices 102 of the array 101.

It is known from a paper by Iizuka et al. ("Volume-Type Holographic Antenna", IEEE Trans. on Antennas and Propagation, November 1975, pp. 807–810) that a holographic plate may be used as a beam shaping antenna. Such a plate enables a desired aperture distribution across the hologram to be derived from a given illumination incident from a primary feed. In general, at microwave and millimeter wave frequencies, a hologram can be approximated by an appropriate metallization pattern etched on a printed circuit board. In general, the use of a metal pattern will permit a close approximation of the desired phase distribution across the entire aperture. The Iisuka et al. paper describes an antenna that consists of a holographic plate having a metallization pattern illuminated by a spherical wave originating from a horn antenna. The holographic pattern in this case consists of a set of concentric circular rings spaced one wavelength apart from one another. When the plate is illuminated by a spherical wave radiated from the horn aperture, the wave scattered from the metal rings have the same phase (same wave phase front), creating two beams travelling in opposite directions normal to the plate surface, i.e., the true image and its conjugate are thereby reconstructed in a holographic sense. When two plates are used in a parallel arrangement, the pattern in the second plate and its spacing can be designed in such a way that the backward radiation is canceled and the forward beam radiation is reinforced. For example, if the plates are spaced a quarter wavelength apart, and the metal rings on the second plate have a radii of a quarter wavelength larger than those of the first plate. The desired interference pattern will be achieved.

Beam shaping is possible by modifying the metallization pattern of the plates. Additionally, the spacing of the plates can be adjusted to achieve a particular radiation pattern.

FIG. 4 depicts a top plan view of an ideal hologram pattern 400 for a particular antenna type. The antenna operates at 35 GHz and produces a Gaussian beam having a eamwidth of three degrees. This transmittance pattern is developed using continuous levels such that the light bars 402 represent areas of conductivity and the dark bars 406 represent areas of nonconductivity. The feed is provided in the center at reference 404.

FIG. 5 depicts a binary representation 500 of the pattern of FIG. 4. The binary representation is developed by a plurality of lines of SPIN devices (shown in detail at 502) as discussed above with reference to FIG. 1. These devices 504 have dimensions that define a rectangular plan form, where the dimension of each SPIN device is small relative to the RF wavelength used to excite the antenna, i.e., approximately 50 microns wide and 100 microns long. The white rows of devices 504 are the active devices and the black rows 506 are inactive devices. By selectively activating and deactivating devices, the hologram pattern 400 of FIG. 4 is approximated by the hologram 500 of FIG. 5. Consequently, the devices act as a metallization pattern to facilitate generation of a radiation pattern when the hologram is excited by an RF surface wave as shall be discussed below.

FIG. 6 depicts a top plan view of a practical implementation of the reconfigurable holographic antenna 600 of the present invention. FIG. 7 depicts a side view of the antenna 600 of FIG. 6 and FIG. 8 depicts an exploded view of the antenna of FIG. 6. To best understand the invention, FIGS. 6, 7 and 8 should be referred to simultaneously. The antenna 600 comprises an array of SPIN devices 702 that are activated (represented by arcs 704) and deactivated (represented by white spaces 706) by the application of the DC voltage to each SPIN device. The DC voltage is supplied from an antenna base 708 (a circuit board) having the addressing circuitry 800 that couples DC power to a plurality of bias pins 710 that pass through a dielectric material 712 to contact each of the contact regions of each SPIN device. The dielectric material 712 is, for example, beryllium, low temperature, cold fired ceramic, or other insulating material that is structurally sufficient to retain the bias pins 710. When certain ones of the SPIN devices are activated, a pattern (arcs 704) is produced on the surface of the active silicon wafer 714.

A dielectric layer 716 is mounted on top of the active silicon wafer 714 and a feed dipole 718 is located atop the dielectric layer 716. The dielectric layer 716 is a composite substrate fabricated, for example, of silicon and glass, silicon and quartz, or other materials that can facilitate propagation of a surface wave as discussed below. The dielectric layer 716 is not depicted in FIG. 6 to facilitate showing the holographic pattern formed by the active SPIN devices. The feed dipole 718 is deposited by conventional metallization techniques such as physical vapor deposition of aluminum or copper. The feed dipole is generally coupled through a balun (not shown) to an RF transmitter or receiver. Alternatively, a RF horn feed structure can be used instead of a dipole. The horn excites a surface wave in the dielectric layer 716 in a manner similar to that of the dipole. The horn is generally coupled to a transmitter or receiver by a waveguide.

An absorbing ring 720 circumscribes the entire structure to absorb RF energy that propagates across the surface of the dielectric 716 towards the edge of the antenna structure 600. The absorbing ring 720 is fabricated of a "lossy" material such as resistive paint. To insure that the devices 702 operate as a metallization pattern, the size of each device should be less than $\lambda/10$ where $\lambda$ is the radiation wavelength that is applied to the dipole 718. By placing the dipole 718 on the dielectric 716, the RF energy is efficiently coupled from the dipole 718 to the active SPIN devices 704 that form secondary radiators of the holographic pattern. In this structure, the energy generated by the primary feeder, i.e., the dipole 718, is guided along the dielectric surface as a surface wave and the spurious radiation load can be effectively suppressed by the surrounding dielectric with the absorbing ring 720. The absorbing ring dissipates the radiation signal which escapes coupling to the secondary radiators and suppresses the spurious lobe by preventing surface wave diffraction over the edges of the antenna 600.

Bias is provided to the SPIN devices 702 via a plurality of bias pins 710 mounted in a low dielectric constant material 712. The conductive pins are directed normal to the semiconductor surface of the backside of the antenna 600. This arrangement takes advantage of the fact that the primary radiation field is polarized parallel to the antenna surface. Thus, vertically mounted pins would not substantially disturb the field. Moreover, in view of the fact that the surface wave field is highly localized near the surface of the dielectric 716, the biasing pins need not be very long to effectively separate the control electronics from the RF radiation. The pins are in contact with both of the contacts (110 and 112 in FIG. 1) of the doped semiconductor regions and the control circuits on the addressing board 708. In other words, the bias pin layer (dielectric 712 and pins 710) is sandwiched between the mounted semiconductor layer 714 and the control board 708. The control board 708 is, for example, a multilayer, cofired ceramic circuit using a mature ceramic technology. Other forms of circuit boards are known to those skilled in the art and may be substituted for the ceramic circuit.

FIG. 9 depicts a holographic pattern 900 formed by activating certain SPIN devices to form arcs 902 and used to develop a particular radiation pattern for an antenna. FIG. 10 depicts a particular radiation pattern 1000 generated by the holographic pattern 900 of FIG. 9. Note that the location of the main lobe 1002 of the antenna radiation pattern 1000 is directed to the center of the image, i.e., the elevation and azimuth of the beam are both 0 degrees. By changing the bias to the SPIN devices and selecting other SPIN devices to change the holographic pattern, the direction of the main lobe of the radiation pattern can be moved and pointed in a controlled manner.

FIG. 11 depicts an altered holographic pattern 1100 from that of the pattern 900 of FIG. 9. This new holographic pattern 1100 offsets the main lobe 1202 of the radiation pattern 1200 to the right of the center as depicted in FIG. 12. Using the pattern 1000 of FIG. 11, the azimuth of the main lobe 1202 is now 15 degrees. Consequently, it can clearly be seen that a simple change in the number and pattern of SPIN devices that are active within the array can steer the antenna's main lobe from location to location. Similar adaptations can be made to match the antenna to various frequency changes as well as alter the polarization of the antenna.

While foregoing is directed to the preferred embodiment of the present invention, other and further embodiments of the invention may be devised without departing from the basic scope thereof, and the scope thereof is determined by the claims that follow.

What is claimed is:

1. A reconfigurable antenna comprising:
    a substrate;
    a plurality of surface PIN devices supported by said substrate, where at least one surface PIN device is activated to inject carriers near a surface of an intrinsic region of the at least one surface PIN device to alter the conductive characteristics of the surface of the intrinsic region; and
    a feed element for coupling energy to said surface PIN devices.

2. The reconfigurable antenna of claim 1 wherein said substrate is a semiconductor substrate.

3. The reconfigurable antenna of claim 1 wherein said plurality of surface PIN devices are arranged in an array.

4. The reconfigurable antenna of claim 1 wherein the feed element is at least one surface PIN device.

5. The reconfigurable antenna of claim 1 wherein the feed element is a dipole antenna.

6. The reconfigurable antenna of claim 1 further comprising:
    a base comprising drive electronics; and
    a dielectric layer containing conductive pins that couple bias signals from the base to the surface PIN devices.

7. The reconfigurable antenna of claim 1 further comprises:
    a dielectric layer positioned atop the substrate; and
    wherein the feed element is a dipole antenna mounted to a surface of the dielectric layer.

8. The reconfigurable antenna of claim 1 wherein a selection of the plurality of surface PIN devices are activated to form a holographic antenna.

9. The reconfigurable antenna of claim 8 wherein a different selection of the plurality of surface PIN devices are activated to form a different holographic antenna.

* * * * *